(12) United States Patent
Lam et al.

(10) Patent No.: US 6,237,056 B1
(45) Date of Patent: May 22, 2001

(54) APPARATUS AND METHOD FOR HIGH SPEED BOARD-TO BOARD RIBBON CABLE DATA TRANSFER

(75) Inventors: Chris Lam, San Jose; James Burnham, Sunnyvale, both of CA (US)

(73) Assignee: Videon, Inc., San Jose, CA (US)

( * ) Notice: Subject to any disclaimer, the term of this patent is extended or adjusted under 35 U.S.C. 154(b) by 0 days.

(21) Appl. No.: 09/615,966

(22) Filed: Jul. 14, 2000

(51) Int. Cl.$^7$ ...................................... G06F 13/00
(52) U.S. Cl. ............... 710/126; 710/129; 710/62; 710/106
(58) Field of Search .................... 710/126, 129, 710/100, 101, 62, 128, 63, 106

(56) References Cited

U.S. PATENT DOCUMENTS 5,785,550 * 7/1998 Leshem et al. ................. 439/497
5,953,540 * 9/1999 Raymond ......................... 326/30
6,070,206 * 5/2000 Lohmeyer et al. ............... 710/101

* cited by examiner

*Primary Examiner*—Ario Etienne
(74) *Attorney, Agent, or Firm*—Howard E. Lebowitz

(57) ABSTRACT

A high speed board-to-board data transfer system capable of data transfer over single ended ribbon cable between a slave device and a master device. A slave device comprises a plurality of drivers generating clock signals at above 40 MHz connected to cable connector pins by a trace line through a series termination resistor. A master device comprises a plurality of receivers corresponding to the drivers connected to cable connector pins through a trace line. The ribbon cable is a single-ended ribbon cable using a ground-signal-ground configuration. The drivers, trace lines, resistors, cables, and receivers are chosen to provide reliable data transfer above 40 MHz, preferably between 40 MHz and 80 MHz. Preferred master and slave devices comprise VESA VIP 2.0 masters and slaves transmitting high quality video.

28 Claims, 3 Drawing Sheets

FIG. 3

| Signal Name | Connector Contact | Connector Contact | Signal Name |
|---|---|---|---|
| VIPCLK | 1 | 2 | Ground |
| HCTL | 3 | 4 | HAD[0] |
| HAD[1] | 5 | 6 | HAD[2] |
| HAD[3] | 7 | 8 | HAD[4] |
| HAD[5] | 9 | 10 | HAD[6] |
| HAD[7] | 11 | 12 | VID[0] |
| VID[1] | 13 | 14 | VID[2] |
| VID[3] | 15 | 16 | VID[4] |
| VID[5] | 17 | 18 | VID[6] |
| Ground | 19 | 20 | keypin |
| VID[7] | 21 | 22 | Ground |
| PIXCLK | 23 | 24 | Ground |
| VIRQ# | 25 | 26 | Ground |
| VRST# | 27 | 28 | XPIXCLK |
| XVID[0] | 29 | 30 | Ground |
| XVID[1] | 31 | 32 | XVID[2] |
| XVID[3] | 33 | 34 | XVID[4] |
| XVID[5] | 35 | 36 | XVID[6] |
| XVID[7] | 37 | 38 | SDA |
| SCL | 39 | 40 | Ground |

FIG. 4

| Signal Name | Connector Contact | Connector Contact | Signal Name |
|---|---|---|---|
| VIDA | 1 | 2 | Ground |
| VIDB | 3 | 4 | Ground |
| XVIDA | 5 | 6 | Ground |
| XVIDB | 7 | 8 | Ground |
| Reserved | 9 | 10 | Ground |

APPARATUS AND METHOD FOR HIGH SPEED BOARD-TO BOARD RIBBON CABLE DATA TRANSFER

BACKGROUND OF THE INVENTION

1. Field of the Invention

This invention relates to an apparatus and method for high speed data transfer between PCB boards using ribbon cable.

2. Description of the Prior Art

There are several standards for ribbon cable interconnection known today. Three of the most advanced systems are Ultra ATA-66, ULTRA-2 SCSI and Wide ULTRA-2 SCSI. The Ultra ATA-66 standard allows data transfer at up to 66.6 MB/s burst data transfer rate at 33 MHz clock rate over 80 conductor wire using 40 signal and 40 interleaving ground conductors with 40 receptacle connectors. The ULTRA-2 SCSI and Wide ULTRA-2 SCSI allow burst data transmission of 40 and 80 MB/s at 40 MHz. with 8 bit and 16 bit buses respectively. ULTRA-3 SCSI promises double the Wide ULTRA-2 SCSI rates. However, the ULTRA-2 SCSI and ULTRA-3 SCSI systems require the use of twisted pair ribbon cables to support Low Voltage Differential where each signal is sent over two wires. Also the SCSI systems require complex active terminators and utilize data verification techniques such as CRC, which have substantial overhead and which limit the techniques where direct isochronous transfer is required.

High frequency board-to-board data transmission by ribbon cable is limited by issues of signal integrity including the following: a. driver characteristics such as slew rates, propagation delay and signal reflection; b. transmission line effects such as signal reflection impact, termination methodology, incident wave switching, load configurations, connectors, and ribbon cables; c. receiver capabilities, such as thresholds, signal skews, setup/hold times, and loading; and d. cross talk, involving the ribbon cable, signal pin-out, PCB traces, and EMI considerations. All of these factors make it uncertain whether a high speed data transmission over a given ribbon cable connection can maintain data integrity.

Many data transfer systems require both high speed and high bandwidth transfer. One particular system is high performance video transfer. The Video Electronics Standards Association (VESA) has recently adopted Version 2.0 of a Video Interface Port (VIP) Standard, which is a dedicated physical connection between a graphics adapter (a VIP master) and video devices such as MPEG-2 or HDTV decoders, video digitizers, video encoders, etc. (a VIP slave). Such high performance video transfer systems as VIP require reliable data transfer, which is isochronous (real time) and very high bandwidth (VIP 2.0 requires 150 MB/s transfer rate). Because of the limitations on reliability of high speed ribbon cable connections VESA did not adopt a ribbon cable implementation of its VIP 2.0 standard which operates with up to a clock rate of 80 MHz, and contemplates that the standard will be implemented by both master and slave mounted on a single board or a mother-daughter board arrangement. The earlier VIP version 1.1, which operated at 33 MHz included a ribbon cable transfer option. The single board requirement of VIP 2.0 is a significant limitation, since graphic controllers and video devices are typically manufactured by different manufacturers. The objective of the VIP Standard was to assure that devices manufactured by different parties could interface seamlessly. This objective is substantially compromised by the single board requirement.

Other PC based systems for real-time video transfer are not adequate for connecting VIP 2.0 slaves and masters. IEEE 1394 (known as Fire Wire) is isochronous but does not provide high enough transfer rates, USB is likewise too slow for high performance video. Fast PC bus structures such as PCI and AGP are asynchronous buses and cannot provide the needed direct isochronous interconnect.

There is a need for a reliable board-to-board data transfer system for transfer of data above 40 MHz based on readily available and inexpensive components comprising single-ended ribbon cable and connectors, whereby high speed data generated on a slave board constructed according to the system can reliably transfer the data to a master constructed according to the system by a ribbon cable of the system without the signal integrity reliability issues.

There is a need for an inexpensive and reliable system for direct linkage of VESA VIP 2.0 master and slave devices mounted on different boards.

There is a need for an inexpensive and reliable system for direct ribbon cable linkage of VESA VIP 2.0 master and slave devices mounted on different boards such that a board containing a slave of the system will reliably and isochronously link with a master of the system by a cable of the system.

There is a need for a reliable method for data transfer between boards at greater than 40 MHz using inexpensive and readily available single-ended ribbon cable.

SUMMARY OF THE INVENTION

One embodiment of the invention is a system for high speed board-to-board data transfer at between 40 and 80 MHz, between a slave device and a master device by a single-ended ribbon cable. A slave device according to the invention comprises a plurality of high speed primary drivers providing signals at from 40 to 80 MHz mounted on a slave printed circuit board. One of the signals should be a clock signal. The drivers are usually output circuits on an IC chip driving an output pin on the chip, but may also be external drivers mounted on the board. Each driver is connected to a ribbon cable connector pin mounted on the board by a primary driver trace line and has a series termination resistor between the driver and the ribbon connector pin. There can also be an optional set of secondary high speed drivers on the slave board also generating 40 to 80 MHz signals. Each secondary driver is connected to the corresponding primary trace line by a secondary trace line.

A master device according to the invention comprises a plurality of ribbon cable connector pins mounted on a master printed circuit board, a plurality of primary receivers one corresponding to each high speed transfer driver, and a plurality of primary trace lines connecting the cable connector pins on the master board and each of the primary receivers. Generally the receivers are input circuits on an IC chip receiving an input signal at an IC pin. The master board can also have a plurality of secondary receivers each connected to a primary trace line by a stub trace.

A ribbon cable according to the invention is a single-ended flat ribbon cable with a connector at each end. The cable preferably uses a ground-signal ground configuration. A preferred 40 pin cable of this type is an Ultra ATA cable with two Primary Drive Connectors. This type of cable is made with 80 conductor cable where 40 of the interleaving conductors are connected to a common ground and the 40 remaining conductors are connected to pin receptacles. An alternative cable would be to use cable and connectors with at least twice as many conductors as there are pins on the board and to ground alternate pins.

A preferred slave device comprises a VESA VIP 2.0 compliant slave. A VIP 2.0 slave supporting 8 bit video mode has 40 ribbon cable connector pins on the slave board corresponding to the 40 pins specified for the VIP 2.0 slave in 8 bit mode, while an VIP 2.0 slave supporting 10 bit extended video mode requires 50 ribbon cable connector pins corresponding to the 50 pins specified for a VIP 2.0 slave supporting 10 bit extended graphics. The cable connector pins include pins connected to primary transfer drivers and optional secondary drivers, other slower speed drivers such as those corresponding to the VIP host bus, and pins which are grounded.

A preferred master device is comprises a VESA VIP 2.0 compliant master. A VIP 2.0 master may support 8 bit video mode or 10 bit extended video mode corresponding to the options available for a VIP 2.0 slave and have either 40 or 50 pins corresponding to those of a VIP 2.0 slave.

A preferred ribbon cable for connecting 40 pin devices or 40 pins of 50 pin devices is an Ultra ATA cable with two Ultra ATA Primary Drive Connectors. A preferred ribbon cable for connecting the remaining 10 pins of a 50 pin device is a 10 pin 0.5 inch flat single ended ribbon cable with 10 pin 0.1 inch center dual row connectors. The pin assignment for the 10 pins connected by 10 pin cable is such that alternating pins are grounded.

Preferred characteristics of the divers are as follows:

length of primary trace lines less than 4 inches long with the maximum distance from each primary driver to the resistor on its trace line being 1.5 inches;

each trace line should have a characteristic impedance between 55 ohms and 85 ohms, preferably 60 to 65 ohms;

each optional secondary trace line less than 4 inches long;

each resistor on a primary trace line is between 35 and 60 ohms;

each primary and each secondary driver has clock-to-data skew between about 3.58 and 5.92 ns at 87 pF loading, and has a slew rate greater than about 0.53 V/sec measured at 87 pF and be capable of achieving a 10–90% rise and fall time of 6.25 nsec when driving an 87 pF load; and each driver should have a DC drive current of at least 12 mA and minimum dynamic drive current of 41 mA.

Preferred characteristics of receivers are as follows:

minimum receiver set up and hold time should be 3 ns and 0 ns, respectively for each receiver measured at 50% of supply voltage;

combined capacitive loading of the package and chip for each load should not exceed 8 pF per pin;

4 inch maximum length of trace lines from ribbon cable connector pin on master board to receiver; and 0.5 inch maximum stub length from each optional secondary receiver to the corresponding primary trace line.

Ribbon Cable Characteristics should be as follows:

Maximum cable length of 24 inches, preferably 18 inches, more preferably 9 inches; and 40 pin cable characteristic impedance between about 70 and about 90 ohms.

General:

The basic I/O high and low voltage thresholds are set by standard TTL criteria, i.e., 0.8V and 2.0V. The TTL-compatible I/O interface circuits have a supply voltage of 3.3 V.

A slave device and a master device according to the invention will reliably transfer data at rates up to 80 MHz over the ribbon cable.

An object of the invention is to provide a reliable system for high speed board-to-board data transfer via readily available single-ended ribbon cable, whereby high speed data generated on a slave board constructed according to the system can be reliably transferred to a master board constructed according to the system without loss of data at frequencies between 40 and 80 MHz.

A further object of the invention is to provide an inexpensive and reliable system for direct connection of VESA VIP 2.0 master and slave devices mounted on different boards.

A further object of the invention is to provide an inexpensive and reliable system for direct ribbon cable connection of VESA VIP 2.0 master and slave devices mounted on different boards such that a board containing a slave of the system will reliably and isochronously link with a master of the system by a cable of the system.

A still further object of the invention is to provide a reliable method for data transfer between boards at greater than 40 MHz using inexpensive and readily available single-ended ribbon cable.

BRIEF DESCRIPTION OF THE DRAWINGS

These and other features, aspects and advantages of the present invention will become better understood with regard to the following description, appended claims and accompanying drawings, where:

FIG. 3 is a preferred pin assignment for the forty pin cable in a VESA VIP 2.0 embodiment of the invention.

FIG. 4 is a preferred pin assignment for the ten pin cable in a VESA VIP 2.0 embodiment of the invention.

DESCRIPTION

Figure 1:
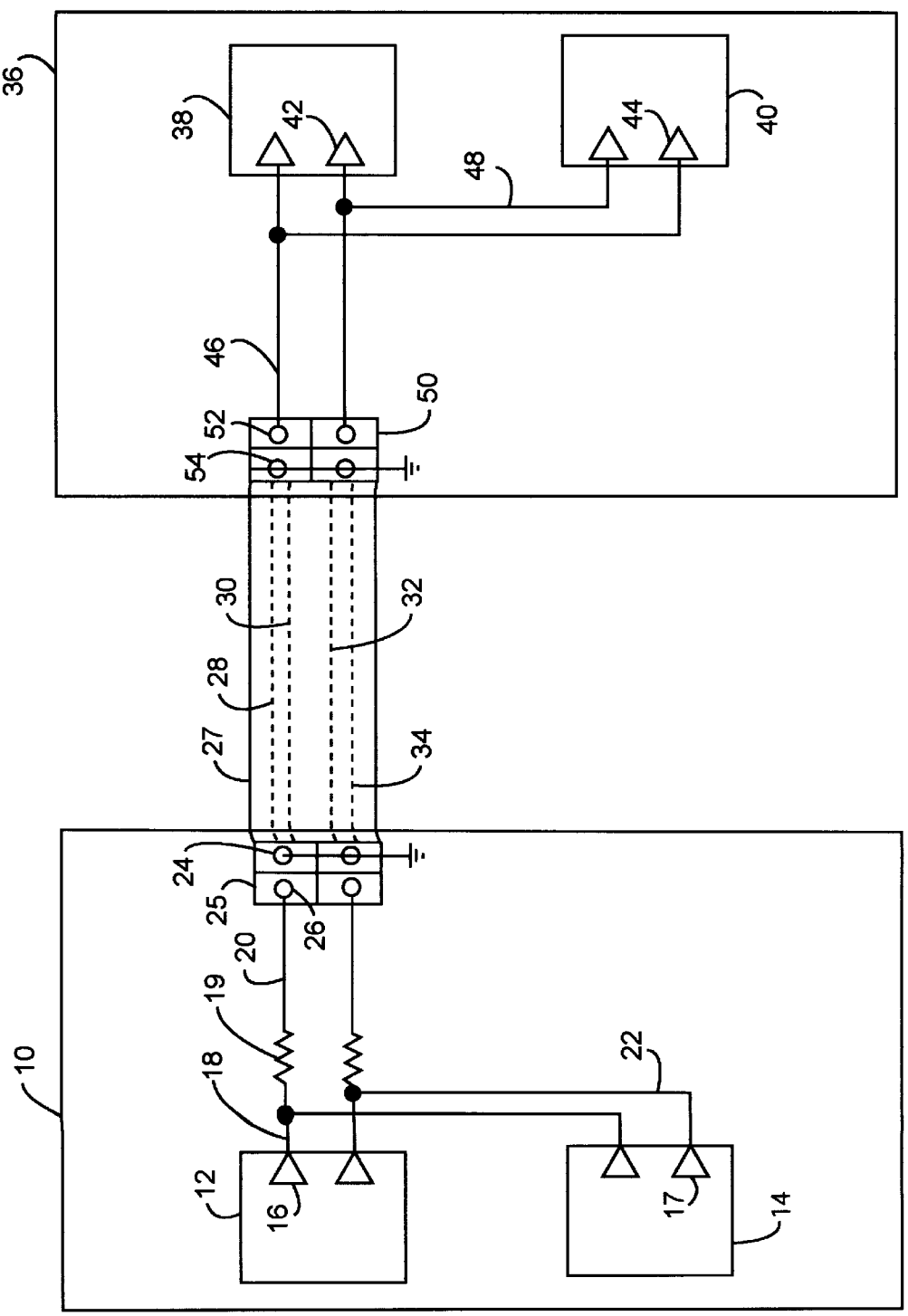
FIG. 1 is a schematic diagram showing a slave device and a master device according to an embodiment of the invention connected by a ribbon cable.

The invention relates to high speed data transfer between printed circuit boards using ribbon cable. In general, the use of ribbon cable for high speed transfer is limited by considerations of signal integrity involving such variables as slew rates, propagation delay and signal reflection; transmission line effects such as signal reflection impact, termination methodology, incident wave switching, load configurations, connectors, and ribbon cables; receiver capabilities, such as thresholds, signal skews, setup/hold times, and loading; and cross talk, involving the ribbon cable, signal pin-out, PCB traces, and EMI considerations. These concerns have limited the use of ribbon cable to applications of sustained transfer below about 40 MHz.

It has now been learned, however, that a useful system involving such high speed transfer may be constructed to solve many useful applications. Devices constructed according to the invention are assured of reliable data transfer.

For this application systems involve slave devices and master devices. A slave device, for the purposes of this invention, comprises a printed circuit board containing one or more integrated circuit chips which produce signals for board-to-board transfers at clock rates between 40 and 80 MHz. The signals are usually produced by the drivers on the IC which drive the voltage signals of the IC pins, though it is also possible to have external drivers on the board as well.

Each board according to the invention can have up to two parallel sets of drivers, primary drivers and optional secondary drivers. The primary and secondary transfer drivers according to this invention are limited to those drivers generating clock signals above 40 MHz which are to be transferred to another board though a ribbon cable. It will be apparent, that in most cases there will be many other drivers as well, including those generating signals at lower speeds which may or may not be transferred along with the high speed signals through the ribbon cable and those which generate signals which are not to be transferred via ribbon cable. This invention is only concerned with those drivers which produce signals above 40 MHz and which are to be transferred through ribbon cable. For the purposes of this invention, slave devices generate high speed signals for transfer through ribbon cable, but do not receive signals above 40 MHz though ribbon cable. However, the slave device may receive signals below 40 MHz through ribbon cable, or may receive high speed signals from another source, such as a bus.

A master device, for the purposes of this invention, comprises a printed circuit board, containing one or more integrated circuits which receive high speed clock signals, between 40 and 80 MHz, generated in a slave device and transferred through a ribbon cable. Each master board can have up to two parallel sets of receivers, primary receivers and optional secondary receivers, generally on two integrated circuits. There can also be other receivers including low speed receivers and receivers which obtain signals from sources other than ribbon cable transfer, however the primary and secondary receivers of this invention are limited to those which receive signals at above 40 MHz from a slave device through a ribbon cable. For the purposes of this invention, master devices receive high speed signals transferred through a ribbon cable, but do not generate signals above 40 MHz to be transmitted though ribbon cable. However, a master device may generate signals below 40 MHz to be transmitted to a slave device through ribbon cable, or may generate high speed signals which are not sent through the ribbon cable.

A ribbon cable, for the purposes of this invention, refers to ordinary single-ended flat ribbon cable which uses a ground-signal-ground connector configuration. An example of a preferred 40 pin cable is Ultra ATA cable which uses an 80 pin 0.025 inch pitch, flat cable with alternating grounds. Preferred connectors for the Ultra ATA cable are 40 receptacle primry drive connectors. A preferred 10 pin cable is 10 pin 0.5 inch flat ribbon cable with 10 pin 0.1 inch center dual row connectors. The 10 pin cable would be used for 5 active conductors with alternate pins grounded.

The printed circuit board devices of the invention may be part of a computer system, such as add on cards for a personal computer or a workstation or they may be parts of other appliances. They may be in one single appliance, they may be also connected by buses other than ribbon cable, or they may be in two separate appliances. All of the above circumstances could be embodiments of the instant invention which pertains to that system which generates, links, and receives data at above 40 MHz through ribbon cable.

A preferred embodiment of the invention involves board-to-board transfer of high quality video data in accordance with the VESA® VIP 2.0 standard. VESA refers to the Video Electronics Standards Association and VIP refers to Video Interface Port. The standard is stated in the VESA Video Interface Port (VIP) Standard, Version 2.0 , dated Oct. 23, 1998 published by the Video Electronics Standards Association, 2150 North First Street, Suite 440, San Jose, Calif. 95131-2029, which document is hereby included in this patent application by reference in its entirety. The Standard allows for one high frequency signal byte, XVID [7:0] to be bi-directional between the VIP 2.0 master and slave in Level III. "Bi-directional" is defined as clock and data going in opposite directions. As previously noted, the instant invention does not include bi-directional transfer of high frequency signals over the ribbon cable, and for the purposes of this application, VIP 2.0 compliant masters and slaves do not include bi-directional transfer.

FIG. 1 shows one embodiment of the invention comprising a slave printed circuit board 10 connected to a master printed circuit board 36 by a ribbon cable 27. The slave board 10 includes two integrated circuits (IC) 12 and 14. Each IC has two drivers generating high speed signals at a frequency above 40 MHz, preferably between 40 MHz and about 80 MHz. The drivers 16 on IC 12 are denoted as primary drivers and the drivers 18 on IC 14 are denoted as secondary drivers. Slave boards according to this invention generally have at least one set of drivers, generally having at least one data signal and one clock signal. Optionally, boards can have one secondary set of drivers. The drivers are generally the circuits which drive IC pins, but could also be separate circuits mounted on the board. A trace line on the board 18 connects a primary driver 16 with a resistor 19 mounted on the board in series with the driver. A continuation 20 of the trace line connects the resistor 19 with a ribbon cable connector pin 26. A secondary driver 17 is shown connected to primary trace line 18 by a secondary trace line 22. It will be apparent, that in most cases there will be many other drivers as well on the slave board, including those generating signals at lower speeds, and those which generate signals which are not to be transferred via ribbon cable. This invention is only concerned with those drivers which produce signals above 40 MHz and which are to be transferred through ribbon cable.

The master board 36 includes two IC's 38 and 40 containing primary receivers 42 on IC 38 and optional secondary receivers 44 on IC 40. Each primary receiver 42 is connected to a ribbon cable connector pin 52.

The ribbon cable 27 has a connector 25 on the slave board and connector 50 on the master board. The cable 27 has four conductors 28, 30, 32, and 34. Conductors 28 and 32 connect the cable connector pins 26 on the slave board which carry the high speed signals from the trace lines 20 with the corresponding pins 52 on the master board by conductors 28 and 32, while alternate conductors 30 and 34 connect grounded pins 24 on the slave board and grounded pins 54 on the master board. Use of ribbon cable with grounded conductors separating the conductors carrying the active signals is an important feature of the invention.

Figure 2:
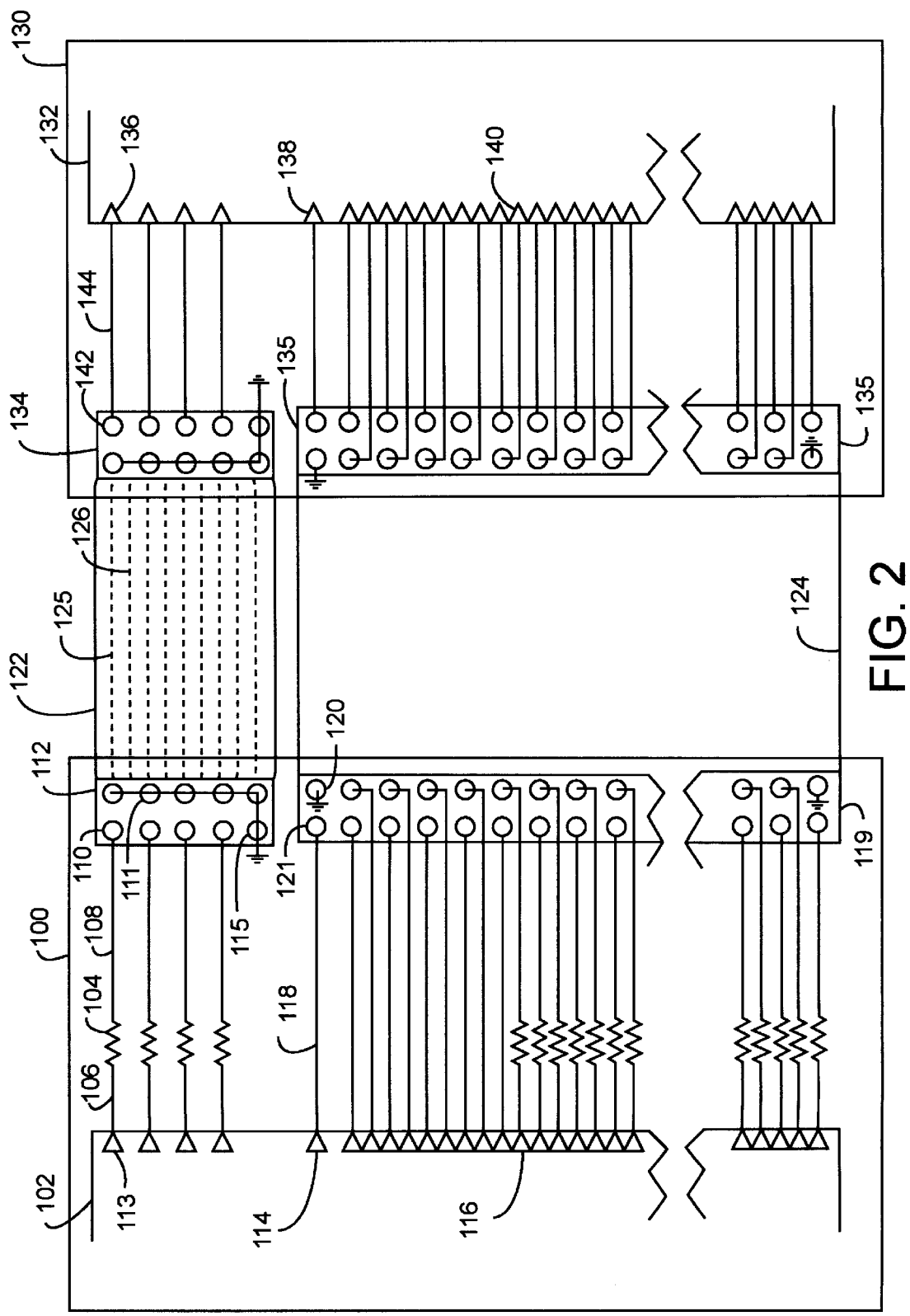
FIG. 2 is a schematic diagram showing VESA VIP 2.0 Slave and Master devices which support 10 bit video mode according to an embodiment of the invention connected by a forty pin and a ten pin ribbon cable.

FIG. 2 shows a preferred embodiment of the invention where a slave board 100 comprises a VESA VIP 2.0 compliant slave chip 102, having a plurality of high speed video drivers 113 and 116 producing signals at 75 to 80 MHz and slow speed drivers 114. The high speed drivers are connected to ribbon cable connector pins 110 by a trace line 106 with a resistor 104 in series with the driver and an extension of the trace line 108 between the driver and the ribbon cable connector pins. There are also a number of low speed drivers 114 shown connected to cable connector pins 121 by trace lines 118, which correspond to the VIP 2.0 host bus. There are a total of fifty pins on the board including pins which are connected to high speed drivers, such as 113, and 116; pins which are connected to low speed drivers such as 114; and pins which are grounded, such as pins 111 and 120; and pins which are reserved for possible other uses, such as pin 115.

The 50 pins correspond to the fifty pins specified by the VIP 2.0 standard supporting 10 bit video mode, arranged for connection by two ribbon cables a ten pin cable to connect the top ten pins and a forty pin cable to connect the remaining forty pins. For convenience, both high speed and low speed drivers are aggregated, however the requirements of this invention which are enumerated for properties of the drivers, trace lines, resistors and cables apply only to the high speed signals. A complete preferred pin assignment for the VIP 2.0 pins is given in FIGS. 3 and 4.

Moving on in FIG. 2, a master board 130 comprises a VIP 2.0 master chip 132 having a plurality of receivers 136, and 140 corresponding to high speed drivers, 113 and 116 on the slave board and receivers 138 corresponding to low speed drivers 114 on the slave board. Each receiver is connected to a ribbon cable connector pin 142 by a trace line 144.

The pins are arranged to correspond to the pins on the slave board.

The fifty pins on the master board are shown connected to the fifty pins on the slave board by two ribbon cables, one cable 122 connecting ten pins on each board, and a second ribbon cable 124 connecting forty pins. Connectors 112 on the slave board and 134 on the master board connect the top ten pins through ribbon 122. Connectors 119 on the slave board and 135 on the master board connect the bottom forty pins through ribbon cable 124. Cable 122 is ordinary ten pin 0.5 inch flat ribbon cable. The pin assignments for the ten pins to be connected through Cable 122 were chosen so that alternating pins were assigned to grounded pins in the VIP 2.0 standard (See FIG. 4), so that alternate conductors in the ribbon are grounded. For instance, conductor 125 is connected to a pin with a high speed signal generated in driver 113 and conductor 126 is connected to a grounded pin 111. Separating active conductors in the ribbon cable by a grounded conductor is an important feature of the invention. Connectors 112 and 134 are 10 pin 0.1 inch center dual row connectors.

Ribbon cable 124 is a Ultra ATA 80 pin 0.025 inch pitch flat cable having alternate grounds. The connectors 119 and 135 are 40 receptacle Ultra ATA master drive connectors having all the signal pins intact.

The preferred pin assignments for the bottom 40 pins of the VIP 2.0 slave and master boards are shown in FIG. 3. The pin assignments for the top 10 pins are given in FIG. 3. Together these correspond to the 50 pin assignments for a VESA 2.0 master and slave supporting ten bit video modes. It should be noted that VIP 2.0 devices which support only eight bit mode will look exactly the same except that the four drivers and receivers corresponding to the extended data bits, VIDA, VIDB, XVIDA, and XVIDB are omitted (these are shown as the top 4 drivers and receivers on FIG. 2) as are the corresponding ground and reserved pins, and the 10 pin ribbons and connectors. Eight bit mode devices have only 40 pins per board, the Ultra ATA ribbon cable, and Ultra ATA master drive connectors. The pin assignments could be varied so long as both master and slave devices used the same convention, however it is preferable that high frequency PIXCLK signal be isolated between grounded conductors, connector 23 is between ground connectors 22 and 24.

The drivers, receivers, trace lines, resistors and cables for the high speed signals, those having a frequency above 40 MHz, and preferably below about 80 MHz, should be constructed according to certain special specifications in order to assure reliable data transfer. These specifications are given below.

Interconnection

The invention is intended to use with single-ended ribbon cable using a ground-signal-ground configuration. A preferred 10 pin cable is 10 pin 0.5 inch flat ribbon cable. A preferred connector is a 10 pin 0.1 inch center dual row connector. A preferred cable for use with a forty pins is Ultra ATA cable which is an 80 pin cable with alternating grounds, 0.025 inch pitch, flat cable. A preferred 40 pin connector is a Ultra ATA master drive connector. It is important to note that there are three types of Ultra ATA connectors, primary (master) drive connectors (black), secondary drive connectors (gray), and system board connectors(blue). A normal Ultra ATA cable and connector assembly contains all three types of connectors and is not suitable for use in this invention. The preferred forty pin cable for this invention comprises the 80 pin wire with two master (black) connectors. A preferred connector is a primary connector of the ATAS design by Circuit Assembly Corp.

For forty pin cable, a preferred single ended transmission line characteristic impedance is between 70 and 90 ohms.

Cables according to this invention should be less than 24 inches long, preferably less than 18 inches long and most preferably less than 9 inches long for maximum reliability.

Ribbon cable connectors are preferably of the plug type (male) and cable connectors are preferably of the receptacle (female) type.

Slave Boards

Up to two drivers are allowed for each high speed signal, a primary driver and a secondary driver. The trace length between the driver package pin and the corresponding ribbon connector is preferably less than four inches, and length variations per clock domain signal group should be kept below one inch. Microstrip (surface trace over a ground plane) or equivalent construction is preferred. A termination resistor preferably having a resistance between 35 and 60 ohms and more preferably between 45 and 50 ohms should be placed in series with the line as close as possible to the driver pin, preferably not more than 1.5 inches from the pin. If an optional secondary driver is used the trace line from the second driver pin should connect to the first between the package pin and the series termination resistor, with a total length preferably below 4 inches with variations per clock domain signal group preferably less than 1 inch.

The single-ended transmission line characteristic impedance ($Z_0$) of trace lines should preferably range from 55 ohms to 85 ohms. A preferred configuration for microstrip using one ounce copper (about 1.43 mils thick) is 5 mil wide traces centered 5 mils apart (i.e., a trace pitch of 10 mils) with a dielectric thickness of 5 mils and a dielectric constant of 4.3 (assuming FR-4 material). Such a construction has a characteristic impedance of about 65 ohms.

Master Boards

Each high speed signal may have up to two receiver loads, a primary receiver and a secondary receiver. Each primary receiver is connected to its ribbon cable connector pin by a trace line which is preferably less than four inches long. Each secondary receiver is connected to the corresponding primary receiver by a trace line stub which is preferably less than 0.5 inches long. Each load shall have a maximum capacitive load of 8 pF for any pin.

The single ended transmission line characteristic impedance ($Z_0$) of trace lines should preferably range from 55 ohms to 85 ohms. A preferred configuration for microstrip using one ounce copper (about 1.43 mils thick) is 5 mil wide traces centered 5 mils apart (i.e., a trace pitch of 10 mils) with a dielectric thickness of 5 mils and a dielectric constant of 4.3 (assuming FR-4 material). Such a construction has a characteristic impedance of about 65 ohms.

Driver and Receiver Dynamics

The basic I/O high and low voltage thresholds should be compatible with the Standard TTL criteria of 0.8V and 2.0V. Such TTL compatible I/O interface circuits should have a supply voltage of 3.3V.

Drivers preferably have a minimum dynamic drive current of 41 mA. A preferable driver is a 12 mA tri-state I/O driver cell. A preferable cell is the TSMC PDB42DGZ. Drivers should be capable of 10–90% rise and fall time of 6.25 ns, and have a propagation delay time between 3.58 ns and 5.92 ns with 87 pF loading, and have a slew rate greater than 0.53 V/ns.

Receiver setup time should preferably be a minimum of 3 ns and preferably less than 2 ns. The minimum receiver hold time is preferably 0 ns. The above set up and hold times are measured at 50% of supply voltage. The combined capacitive loading of the package and chip for each load should be less than 8 pF for any pin.

The duty cycle for all clocks preferably varies within 40% and 60%.

Within the above description of specifications the cables, printed circuit boards and IC's and other components are otherwise conventional, and the method of making and assembling them is entirely well known to those skilled in the art and will not be firther described.

An embodiment of the invention is a method for high speed data transfer comprising providing a master and slave device as described above, and connecting them with a ribbon cable as described above. A particularly advantageous way of using the above method involves the fact that master devices and slave devices which satisfy a general standard such as VIP 2.0 will be able to reliably transfer data if the individual masters and slaves meet the board, driver, and receiver requirements of this invention when connected by ribbon cables according to the invention. Thus slave devices and master devices can be manufactured independently and confidently linked.

A slave and a master board according to the invention are able to transmit and receive video data at 150 MB/s in the 8 bit video mode, i.e., 75 MHz×16 bits bus width.

The invention provides a reliable system for high speed board-to-board data transfer via readily available single-ended ribbon cable, whereby high speed data generated on a slave board constructed according to the system can be reliably transferred to a master board constructed according to the system without loss of data at frequencies between 40 and 80 MHz.

The invention also provides an inexpensive and reliable system for direct ribbon cable connection of VESA VIP 2.0 master and slave devices mounted on different boards such that a board containing a slave of the system will reliably and isochronously link with a master of the system by a cable of the system.

Although the present invention has been described in considerable detail with reference to certain preferred versions thereof, other versions are possible. Therefore the spirit and scope of the appended claims should not be limited to the preferred versions herein.

What is claimed is:

1. A high speed board-to-board data transfer system for use with single ended ribbon cable, the system comprising a slave device, the slave device comprising:

a slave printed circuit board;

a plurality of primary transfer signal drivers mounted on said slave board, each generating a primary transfer signal including at least one of said primary drivers generating a primary clock signal at a frequency ranging from 40 MHz to about 80 MHz;

a plurality of primary trace lines on the slave board, one originating at each of said primary drivers;

a plurality of ribbon cable connector pins, a ribbon cable connector pin at the end of each of said plurality of primary trace lines;

a plurality of resistors, one resistor mounted in series on each of said plurality of primary trace lines;

a plurality of optional secondary transfer signal drivers mounted on said slave board, including at least one of said optional secondary drivers generating a secondary clock signal at a frequency ranging from 40 MHz to about 80 MHz, wherein there is at most one optional secondary driver for each primary driver; and a plurality of optional secondary trace lines on the slave board one connecting each of said plurality of optional secondary drivers to one primary trace line of said plurality of primary trace lines, between the one of said plurality of primary drivers at which the one primary trace line originates and the one of said plurality of resistors which is mounted in series on the one primary trace line;

whereby said slave device is capable of reliable data transfer to a master device comprising a master printed circuit board, a plurality of master board ribbon cable connector pins one for each ribbon cable connector pin on the slave board, a plurality of primary receivers, a plurality of master board primary trace lines, one connecting each of said plurality of primary receivers with one of said plurality of master board ribbon cable connector pins, by at least one single-ended ribbon cable having a ground-signal-ground configuration when said at least one ribbon cable connects the plurality of ribbon cable connector pins on the slave board with the plurality of master board ribbon cable connector pins.

2. The system of claim 1 wherein each of said plurality of primary drivers is a circuit in an Integrated Circuit chip.

3. The system of claim 1 wherein at least one of said plurality of primary drivers is an external circuit on said slave board.

4. The system defined in claim 1, wherein each of said plurality of primary trace lines is less than 4 inches long and the maximum distance from each of said primary drivers to the one of said plurality of resistors which is mounted in series with it is 1.5 inches; wherein each of said plurality of optional secondary trace lines is less than 4 inches long; wherein each of said plurality of resistors has a resistance between 35 ohms and 60 ohms; wherein each of said plurality of primary trace lines has a characteristic impedance between 55 ohms and 85 ohms; wherein each of said plurality of primary drivers has a clock-to-data skew between about 3.58 ns and about 5.92 ns measured at 87 pF loading; wherein each of said plurality of primary drivers has a slew rate greater than about 0.53 V/nsec measured at 87 pF loading; and wherein each of said plurality of drivers has a minimum dynamic drive current of 41 mA.

5. The system defined in claim 1 further comprising at least one ribbon cable, said at least one ribbon cable comprising a first connector and a second connector, the first connector and the second connector each comprising a plurality of receptacles, each of said plurality of receptacles being capable of receiving at most one ribbon cable connector pin, and a plurality of conductors each of said plurality of conductors connecting a receptacle on the first connector with a receptacle on the second connector, wherein said ribbon cable is of the single ended type which utilizes ground-signal-ground wiring configuration and wherein said cable is less than 24 inches long.

6. The system defined in claim 4 wherein the at least one of said primary drivers generating a primary clock signal at a frequency ranging from 40 MHz to about 80 MHz, generates the primary clock signal at a frequency ranging from 60 MHz to about 80 MHz.

7. The system defined in claim 4 wherein the at least one of said primary drivers generating a primary clock signal at a frequency ranging from 40 MHz to about 80 MHz, generates the primary clock signal at a frequency ranging from 70 MHz to about 80 MHz.

8. The system defined in claim 4, further comprising at least one ribbon cable, said at least one ribbon cable comprising a first connector and a second connector, said first connector and said second connector each comprising a plurality of receptacles, each receptacle capable of receiving at most one ribbon cable connector pin, and a plurality of conductors, each of said plurality of conductors connecting a receptacle on the first connector with a receptacle on the second connector, wherein said at least one ribbon cable is of the single ended type which utilizes ground-signal-ground wiring configuration and wherein said cable is less than 24 inches long; and a master device, the master device comprising:

a master printed circuit board;

a plurality of master board ribbon cable connector pins mounted on the master board one for each of said plurality of ribbon cable connector pins at the end of a primary trace line on said slave board;

a plurality of primary receivers mounted on said master board one for each of said plurality of primary transfer signal drivers on said slave board, wherein each of said plurality of primary receivers has a maximum combined capacitive load of 8 pF, and has a minimum setup time of 3 ns and a minimum hold time of 0 ns measured at 50% of supply voltage;

a plurality of master board primary trace lines one connecting each of said plurality of master board ribbon cable connector pins with one of said plurality of primary receivers, wherein each of said plurality of master board primary trace lines is less than 4 inches long and has a trace characteristic impedance between 55 ohms and 85 ohms;

a plurality of optional secondary receivers mounted on said master board, wherein each of said plurality of optional secondary receivers has a maximum combined capacitive load of 8 pF, and has a minimum setup time of 3 ns and a minimum hold time of 0 ns measured at 50% of supply voltage and wherein there is at most one optional secondary receiver for each of said plurality of primary receivers; and a plurality of stub traces one connecting each of said plurality of optional secondary receivers to one of said plurality of master board primary trace lines, wherein each of said plurality of stub traces has a length less than 0.5 inches;

whereby each of the plurality of master board ribbon cable connector pins is connected to one of the plurality of ribbon cable connector pins on said slave device by said at least one ribbon cable.

9. The system defined in claim 6, further comprising at least one ribbon cable, said at least one ribbon cable comprising a first connector and a second connector, said first connector and said second connector each comprising a plurality of receptacles, each receptacle capable of receiving at most one ribbon cable connector pin, and a plurality of conductors, each of said plurality of conductors connecting a receptacle on the first connector with a receptacle on the second connector, wherein said at least one ribbon cable is of the single ended type which utilizes ground-signal-ground wiring configuration and wherein said cable is less than 24 inches long; and a master device, the master device comprising:

a master printed circuit board;

a plurality of master board ribbon cable connector pins mounted on the master board one for each of said plurality of ribbon cable connector pins at the end of a primary trace line on said slave board;

a plurality of primary receivers mounted on said master board one for each of said plurality of primary transfer signal drivers on said slave board, wherein each of said plurality of primary receivers has a maximum combined capacitive load of 8 pF, and has a minimum setup time of 3 ns and a minimum hold time of 0 ns measured at 50% of supply voltage;

a plurality of master board primary trace lines one connecting each of said plurality of master board ribbon cable connector pins with one of said plurality of primary receivers, wherein each of said master board primary trace lines is less than 4 inches long and has a trace characteristic impedance between 55 ohms and 85 ohms;

a plurality of optional secondary receivers mounted on said master board, wherein each of said plurality of optional secondary receivers has a maximum combined capacitive load of 8 pF, and has a minimum setup time of 3 ns and a minimum hold time of 0 ns measured at 50% of supply voltage and wherein there is at most one optional secondary receiver for each of said plurality of primary receivers; and a plurality of stub traces one connecting each of said plurality of optional secondary receivers to one of said plurality of master board primary trace lines, wherein each stub line has a length less than 0.5 inches;

whereby each of the plurality of master board ribbon cable connector pins is connected to one of the plurality of ribbon cable connector pins on said slave device by said at least one ribbon cable.

10. The system defined in claim 7, further comprising at least one ribbon, said at least one ribbon cable comprising a first connector and a second connector, said first connector and said second connector each comprising a plurality of receptacles, each receptacle capable of receiving at most one ribbon cable connector pin, and a plurality of conductors, each of said plurality of conductors connecting a receptacle on the first connector with a receptacle on the second connector, wherein said at least one ribbon cable is of the single ended type which utilizes ground-signal-ground wiring configuration and wherein said cable is less than 24 inches long; and a master device, the master device comprising:

a master printed circuit board;

a plurality of master board ribbon cable connector pins mounted on the master board one for each of said plurality of ribbon cable connector pins at the end of a primary trace line on said slave board;

a plurality of primary receivers mounted on said master board one for each of said plurality of primary transfer signal drivers on said slave board, wherein each of said plurality of primary receivers has a maximum combined capacitive load of 8 pF, and has a minimum setup time of 3 ns and a minimum hold time of 0 ns measured at 50% of supply voltage;

a plurality of master board primary trace lines connecting each of said plurality of master board ribbon cable connector pins with one of said plurality of primary receivers, wherein each of said master board primary trace lines is less than 4 inches long and has a trace characteristic impedance between 55 ohms and 85 ohms;

a plurality of optional secondary receivers mounted on said master board, wherein each of said plurality of optional secondary receivers has a maximum combined capacitive load of 8 pF, and has a minimum setup time of 3 ns and a minimum hold time of 0 ns measured at 50% of supply voltage; and wherein there is at most one optional secondary receiver for each of said plurality of primary receivers; and a plurality of stub traces one connecting each of said plurality of optional secondary receivers to one of said plurality of master board primary trace lines, wherein each stub line has a length less than 0.5 inches; whereby each of the plurality of master board ribbon connector pins is connected to one of the plurality of ribbon cable connector pins on said slave device by said at least one ribbon cable.

11. The system defined in claim 7, wherein the slave device comprises a VESA VIP 2.0 compliant slave supporting 8 bit video mode.

12. The system defined in claim 7 wherein the slave device comprises a VESA VIP 2.0 compliant slave supporting 10 bit video mode.

13. The system defined in claim 10, wherein the slave device comprises a VESA VIP 2.0 compliant slave supporting 8 bit video mode, and the at least one ribbon cable comprises an Ultra ATA 80 pin cable having alternating grounds and 0.025 inch pitch flat cable, and wherein the first connector and the second connector each comprise an Ultra ATA primary drive connector.

14. The system defined in claim 10, wherein the slave device comprises a VESA VIP 2.0 compliant slave supporting 10 bit video mode and the at least one ribbon cable comprises a standard cable and an extended cable; wherein the standard cable comprises an Ultra ATA 80 pin cable with alternating grounds and 0.025 inch pitch flat cable, and wherein the first connector and the second connector on the standard cable each comprise an Ultra ATA primary drive connector; and wherein the extended cable comprises 10 pin 0.5 inch flat ribbon cable, and the first connector and the second connector on the extended cable each comprise a 10 pin 0.1 inch center dual row connector.

15. The system defined in claim 13, wherein the master device comprises a VESA VIP 2.0 compliant master supporting 8 bit video mode.

16. The system defined in claim 14, wherein the master device comprises a VESA VIP 2.0 compliant master supporting 10 bit video mode.

17. The system of claim 15 wherein the at least one ribbon cable is less than 9 inches long, and has a characteristic impedance between about 70 ohms and about 90 ohms.

18. The system of claim 16 wherein the standard cable is less than 9 inches long and has a characteristic impedance between about 70 ohms and about 90 ohms, and the extended cable is less than 9 inches long.

19. A master device for use in high speed board-to-board ribbon cable transfer from a slave device, the slave device having a plurality of primary transfer signal drivers each generating a primary transfer signal, including at least one of said primary drivers generating a primary clock signal at a frequency ranging from 40 MHz to about 80 MHz, the master device comprising:

a master printed circuit board;

a plurality of master board ribbon cable connector pins mounted on the master board one for each of said plurality of primary drivers on said slave device;

a plurality of primary receivers mounted on said master board one for each of said plurality of primary drivers on said slave device, wherein each of said plurality of primary receivers has a maximum combined capacitive load of 8 pF, and has a minimum setup time of 3 ns and a minimum hold time of 0 ns measured at 50% of supply voltage;

a plurality of master board primary trace lines on said master board, one connecting each of said plurality of master board ribbon cable connector pins with one of said plurality of primary receivers, wherein each of said plurality of master board trace lines is less than 4 inches long and has a trace characteristic impedance between 55 ohms and 85 ohms;

a plurality of optional secondary receivers mounted on said master board, wherein each of said plurality of optional secondary receivers has a maximum combined capacitive load of 8 pF, and has a minimum setup time of 3 ns and a minimum hold time of 0 ns measured at 50% of supply voltage; and a plurality of stub traces one connecting each of said plurality of optional secondary receivers to one of said plurality of master board primary trace lines, wherein each stub trace has a length less than 0.5 inches.

20. The master device defined in claim 19, wherein the at least one of said primary drivers generating a primary clock signal at a frequency ranging from 40 MHz to about 80 MHz generates the primary clock signal at a frequency ranging from 60 MHZ to about 80 MHz.

21. The master device of claim 20 wherein the master device is a VESA VIP 2.0 compliant master.

22. A method of high speed board-to-board data transfer using single ended ribbon cable comprising the acts of:

providing a slave device comprising a slave printed circuit board, a plurality of primary transfer signal drivers on the slave board each generating a primary transfer signal at a frequency ranging from 40 to about 80 MHz, a plurality of primary trace lines on the board, one primary trace line beginning at each of said plurality of primary drivers, a plurality of optional secondary transfer signal drivers with at most one optional secondary driver for each primary driver, a plurality of optional secondary trace lines one connecting each of said plurality of optional secondary drivers to one of said plurality of primary trace lines, a plurality of ribbon cable connector pins one at the end of each of said plurality of primary trace lines, and a plurality of resistors, one mounted in series on each of said plurality of primary trace lines;

providing a master device comprising a master printed circuit board, a plurality of master board ribbon cable connector pins one for each of said plurality of ribbon cable connector pins on the slave board, a plurality of primary receivers, a plurality of master board primary trace lines one connecting each of said plurality of primary receivers with one of said plurality of master board ribbon cable connector pins, a plurality of optional secondary receivers, and a plurality of stub traces one connecting each of said plurality of secondary receivers with one of said plurality of master board primary trace lines; and connecting each of the plurality of ribbon cable connector pins on said slave device with one of the plurality of master board ribbon cable connector pins with at least one single ended ribbon cable of the type which uses a ground-signal-ground configuration.

23. The method defined in claim 22 wherein a plurality of the primary drivers each generate a signal at a frequency ranging from 60 MHz to about 80 MHz.

24. The method defined in claim 23, wherein each of said plurality of primary trace lines on said slave board is less than 4 inches long and the maximum distance from each of said plurality of primary drivers to the one of said plurality of resistors mounted in series with it is 1.5 inches; wherein each of said plurality of optional secondary trace lines on said slave board is less than 4 inches long; wherein each of said plurality of resistors has a resistance between 35 ohms and 60 ohms; wherein each of said plurality of primary trace lines on said slave board has a characteristic impedance between 55 ohms and 85 ohms; wherein each of said plurality of primary drivers has a clock-to-data skew between about 3.58 ns and about 5.92 ns measured at 87 pF loading; wherein each of said plurality of primary drivers has a slew rate greater than about 0.53 V/nsec measured at 87 pF loading; wherein each of said primary drivers has a minimum dynamic drive current of 41 mA, wherein each of said plurality of primary receivers and each of said plurality of optional secondary receivers has a maximum combined capacitive load of 8 pF, and has a minimum setup time of 3 ns and a minimum hold time of 0 ns measured at 50% of supply voltage; wherein each of said plurality of master board trace lines is less than 4 inches long and has a trace characteristic impedance between 55 ohms and 85 ohms; wherein each of said plurality of stub traces is less than 0.5 inches long; and wherein said at least one single ended ribbon cable is less than 24 inches long.

25. The method defined in claim 24 wherein the master device and the slave device are each compliant with VESA VIP 2.0 supporting 8 bit video mode, and wherein the at least one single ended ribbon cable comprises an Ultra ATA 80 pin cable with alternating grounds, and two connectors, each of said connectors comprising an Ultra ATA primary drive connector.

26. The method defined in claim 24 wherein the master device is a VESA VIP 2.0 master supporting 10 bit video mode, and the slave device is a VESA VIP 2.0 slave supporting 10 bit video mode; wherein the at least one single ended ribbon cable comprises a standard cable and an extended cable; wherein said standard cable comprises an Ultra ATA 80 pin cable with alternating grounds, and two Ultra ATA primary drive connectors; and wherein said extended cable comprises a 10 pin 0.5 inch flat ribbon cable, and two 10 pin 0.1 inch center dual row connectors.

27. The method defined in claim 25 wherein the at least one single ended ribbon cable is less than 9 inches long and has a characteristic impedance between about 70 ohms and about 90 ohms.

28. The method defined in claim 26 wherein the standard cable and the extended cable are each less than 9 inches long and the standard cable has a characteristic impedance between about 70 ohms and about 90 ohms.

* * * * *